United States Patent [19]

Bollinger et al.

[11] Patent Number: 5,561,083

[45] Date of Patent: Oct. 1, 1996

[54] METHOD OF MAKING MULTILAYERED AL-ALLOY STRUCTURE FOR METAL CONDUCTORS

[75] Inventors: Cheryl A. Bollinger, Orlando, Fla.; Edward A. Dein, Horsham, Pa.; Sailesh M. Merchant, Orlando, Fla.; Arun K. Nanda, Austin, Tex.; Pradip K. Roy; Cletus W. Wilkins, Jr., both of Orlando, Fla.

[73] Assignee: Lucent Technologies Inc., Murray Hill, N.J.

[21] Appl. No.: 365,652

[22] Filed: Dec. 29, 1994

[51] Int. Cl.⁶ ............................................... H01L 21/283
[52] U.S. Cl. ........................... 437/190; 437/192; 437/194; 437/199; 437/957
[58] Field of Search ............................... 437/190, 194, 437/198, 192, 199, 957

[56] References Cited

U.S. PATENT DOCUMENTS

| | | | |
|---|---|---|---|
| 4,673,623 | 6/1987 | Gardner et al. | 428/620 |
| 5,266,521 | 11/1993 | Lee et al. | 437/188 |
| 5,332,693 | 7/1994 | Kim | 437/194 |
| 5,345,108 | 9/1994 | Kikkawa | 257/751 |
| 5,395,795 | 3/1995 | Hong et al. | 437/190 |
| 5,407,863 | 4/1995 | Katsura | 437/194 |
| 5,444,022 | 8/1995 | Gardner | 437/195 |

FOREIGN PATENT DOCUMENTS

| | | | |
|---|---|---|---|
| 0064662 | 11/1982 | European Pat. Off. | 437/198 |
| 0132056 | 10/1980 | Japan | 437/198 |

OTHER PUBLICATIONS

Ben–Tzur et al., "Modifications in the Interfacial . . . ", J. Vac. Sci. Technol. A8(6), Nov./Dec. 1990, pp. 4069–4071.

Primary Examiner—T. N. Quach
Attorney, Agent, or Firm—Michael J. Urbano

[57] ABSTRACT

A Si IC includes an Al-based layer which is deposited as a composite of sublayers of different composition Al-based materials. In one embodiment a first sublayer comprises an Al-Si-based alloy disposed so as to prevent substantial Si migration into the first sublayer, and a second sublayer, above the first, comprises an Al-based alloy with substantially no Si to alleviate precipitation-induced problems. The selection of the thickness of the second sublayer to be a major portion and the inclusion of barrier layers are also described.

7 Claims, 1 Drawing Sheet

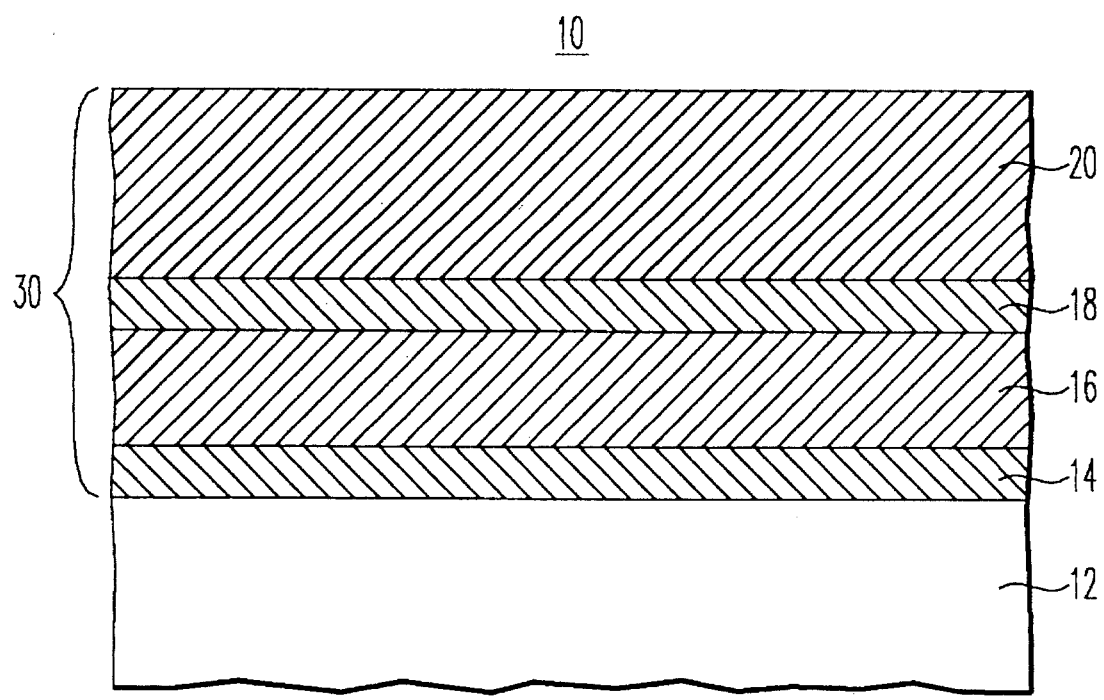

METHOD OF MAKING MULTILAYERED AL-ALLOY STRUCTURE FOR METAL CONDUCTORS

BACKGROUND OF THE INVENTION

This invention relates to metalization for integrated circuits (ICs) and more particularly to Al-based metalization for Si ICs.

In ICs metal layers are used to make electrical contact to device active areas (e.g., as runners between devices on the same level of an IC or as vias between devices on different levels). In both cases, vias or windows with essentially vertical sidewalls are opened in an overlying dielectric layer to expose a portion of an underlying layer (e.g., the semiconductor active areas of devices or the commonly referred to "Metal-1" of the first level of metalization). A plug of metal from an overlying metal layer (e.g., "Metal-1" in the case of a device contacts or the commonly referred to "Metal-2" in the case of interconnects) extends through the via or window and makes an electrical connection between a metal layer and a semiconductor (device contact) or between two metal layers (interconnect). For simplicity, we will hereinafter refer to the electrical connection in both cases (metal to semiconductor, and metal to metal) as an interconnect.

In Si ICs aluminum alloys are the most common materials used for such metal layers. Typically, these Al-based layers are deposited as a single material by means of a single-step deposition such as sputtering.

In windows or contacts to active regions of a device, a typical metalization structure includes sequentially deposited layers of titanium (Ti), titanium nitride (TiN), and optionally another Ti layer, followed by either aluminum-silicon (Al—Si) or aluminum-silicon-copper (Al—Si—Cu) alloys (but not both). The structure is designed to prevent Si migration and junction spiking. That is, Al—Si-based alloys, with the amount of Si satisfying the solubility limit in the Al alloy, are commonly used to prevent the migration of Si from the Si body containing the devices into the Al-alloy, whereas the Ti and TiN layers serve as barrier layers in the metal interconnect to prevent Al spikes from penetrating into the Si body.

Although the use of such Si-containing Al-alloys satisfies the solubility requirements, deposition of Al—Si or Al—Si—Cu on Ti/TiN or Ti/TiN/Ti in conventional apparatus (e.g., a cluster tool) at typical temperatures (e.g., around 200°–400° C.), results in Si precipitation within the Al layer. The Si precipitation reaction is most pronounced at the Al layer free surface and occurs either during the deposition sequence or immediately upon cooling the wafer from the deposition temperature. The reaction is most pronounced in metalization containing Ti-based alloy or compound layers. This Si precipitation reaction results in significant surface roughness of the Al-alloy layer free surface, thus creating processing problems with subsequent lithography steps (patterning); that is, steppers are not able to focus well, resulting in poor printing and linewidth control. Moreover, Si precipitates at the free surface may act as nucleation sites for stress-induced voiding when the Al-based interconnect is encapsulated with a passivation layer such as a dielectric. Therefore, Si precipitation is a problem because it degrades the lithography process via surface roughness and it reduces interconnect reliability via stress-induced voiding.

SUMMARY OF THE INVENTION

These and other problems are addressed in accordance with one aspect of the invention in which an IC includes an Al-based layer which is deposited as a composite of sublayers of different composition Al-based materials.

In one embodiment of a Si IC, a first sublayer comprises an Al—Si-based alloy which prevents substantial Si migration into the first sublayer and a second sublayer, above the first, comprises an Al-based alloy with substantially no Si to alleviate precipitation-induced problems.

In a preferred embodiment, the second sublayer is a major portion of the overall thickness of the Al-based layer in order to improve electromigration characteristics.

BRIEF DESCRIPTION OF THE DRAWINGS

The invention, together with its various features and advantages, can be readily understood from the following more detailed description taken in conjunction with accompanying drawing, in which the sole figure is a schematic cross-section of the metalization of a Si IC in accordance with one embodiment of the invention. The figure has not been drawn to scale for purposes of clarity of illustration.

DETAILED DESCRIPTION

With reference now to the figure, a portion 10 of an IC includes a conductive layer 30 disposed on a body 12. The body 12 is intended to schematically represent any region underlying layer 30; thus, for example, body 12 may comprise a semiconductor body (e.g., a substrate or an epitaxial layer disposed on a substrate) in which device regions are formed. In particular, body 12 may comprise a Si single crystal substrate. Alternatively, body 12 may comprise an insulative layer which separates conductor 30 from other conductors in the IC. In addition, the portion 10 of the IC shown may be located in a window or via where conductor 30 would serve as an interconnect, or it may be located in the field of the IC where conductor 30 would serve as a runner.

In accordance with one aspect of the invention, the conductor 30 comprises first and second sublayers 16 and 20. These sublayers, in turn, comprise different Al-based alloys. In a preferred embodiment, the first sublayer 16 is separated from body 12 by a first barrier layer 14. In another embodiment, the sublayers themselves may also be separated by an optional second barrier layer 18.

Consider that body 12 comprises a semiconductor which includes a migratory material such as Si, which tends to migrate into the conductor 30 during processing. In this case, the first sublayer 16 comprises an Al-based alloy containing sufficient Si therein to satisfy the solubility limit of Si in the alloy. Illustratively, the first sublayer 16 comprises an Al—Si—Cu alloy with the amount of Si therein satisfying the solubility limit.

As noted earlier, however, the presence of Si in an Al-based alloy causes Si precipitation on the surface of the alloy and attendant lithography problems. To alleviate this problem, the second sublayer 20 comprises a different Al-based alloy and, importantly, contains essentially no Si (i.e., none of the migratory material). In addition, the alloy of the second sublayer 20 should desirably have good electromigration characteristics. Illustratively, the second sublayer 20 comprises an Al—Cu alloy with essentially no Si. To take fuller advantage of the enhanced electromigration characteristics of the Al—Cu alloy, it is desirable that the second sublayer 20 comprise a major portion of the thickness of conductor 30. These characteristics may be further improved by capping second sublayer 20 with Ti, TiN or both.

In general, suitable Al-based alloys for Si ICs comprise Al—Si—X for first sublayer 16 and Al—Y for second sublayer 20, where X or Y include Cu, Sc, Ge, Pd, Nb, Mg, Hf, or combinations thereof, by Y includes essentially no Si. The composition of Al—Cu and Al—Si—Cu alloys, in general, may comprise about 0.05–5.0% Cu by weight and 0.05–5.0% Si by weight, with the amount of Si in the first sublayer satisfying the solubility limit of Si in the alloy. Typically the alloys contain 0.5–2.0% Cu and 0.5–1.5% Si by weight with the same proviso.

Likewise, the barrier layers 14 and 18 (when used) typically comprise a refractory metal (e.g., Ti), a refractory metal nitride (e.g., TIN), or a refractory metal alloy (e.g., TiW), or combinations thereof (e.g., Ti/TiN multilayer), all of which are well known in the art, as is their method of fabrication.

In the following illustrative description, it will be assumed that all metal layers are deposited by sputtering, although the invention is not limited to this technique (e.g., evaporation may also be suitable). In addition, the process is conveniently carried out in a state-of-the-art cluster tool or machine with individual deposition chambers. To improve deposition uniformity across a wafer, sputtering is preferably performed using planar targets.

This example utilized a body 12 comprising a Si IC wafer containing device regions (active and/or passive). In a first step a Ti/TiN composite barrier layer 14 was deposited on a major surface of the wafer using well known processes. Next a 3000Å thick first sublayer 16 was sputtered as an Al—Si—Cu alloy comprising about 0.75% Si and 0.50% Cu by weight, the remainder comprising Al. A next step included sputter deposition of a 3000Å thick Al—Cu sublayer 20 directly on sublayer 16 (the optional barrier layer 18 was omitted in this case). Sublayer 20 contained 0.5% Cu with the, remainder being Al; it contained no Si intentionally incorporated into the alloy. As noted earlier, the sublayers need not have the same thickness and, in most cases, it is desirable for the second sublayer to be thicker than the first. Suitable thicknesses include 1500–3000Å for the first sublayer and 3000–6000Å for the second. The amount of Si in the first sublayer is a function of the mass/volume of the sublayer. Therefore, those skilled in the art will adjust the dimensions of the first sublayer 16 to satisfy the solubility requirements.

The sputter deposition of both sublayers took place at a power of 9 kW, a pressure of 2 mTorr and a wafer temperature of 300° C. However, suitable ranges for these processing parameters are about 1–20 kW, about 1–21 mTorr, and about 200°–400° C.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

In summary, the sublayering aspect of the invention allows, on the one hand, control of problems caused by Si migration by means of an Al—Si—Cu first sublayer and, on the other hand, control of problems caused by Si precipitation by means of an Al—Cu second sublayer. The combination reduces stress-induced migration effects (and hence increases reliability), reduces lithography problems due to Si precipitation, and enhances electromigration characteristics due to the properties of Al—Cu alloys. Of course, junction spiking (Al penetration into the Si wafer) is best handled by means of a good quality first barrier layer 14.

We claim:

1. A method of making an integrated circuit which includes an Al-based layer characterized by the steps of:

providing a Si body, depositing a first barrier layer on at least a portion of said body, depositing a first sublayer on said first barrier layer, said first sublayer deposited as an alloy comprising Al and Si so that an amount of Si therein satisfies a solubility limit of Si, depositing a second barrier layer on said first sublayer, and depositing a second sublayer on said second barrier layer, said second sublayer deposited as an alloy of Al with essentially no Si, wherein said first barrier layer, said first sublayer, said second barrier layer, and said second sublayer form a conductive layer, and said second sublayer is a major portion of a thickness of said conductive layer.

2. The method of claim 1 wherein said second sublayer is deposited as an alloy comprising Al and Cu.

3. The method of claim 2 wherein said first sublayer is deposited as an alloy comprising Al and Si or Al, Cu and Si.

4. The method of claim 2 wherein said first and second barrier layers are deposited as materials selected from the group consisting of refractory metals, refractory metal nitrides and refractory metal alloys or combinations thereof.

5. The method of claim 4 wherein said first and second barrier layers are deposited as materials selected from the group consisting of Ti, TiN and TiW or combinations thereof.

6. A method of making an integrated circuit comprising the steps of:

providing a Si body containing device regions, forming a first barrier layer on at least a portion of said body, sputtering an Al—Si based alloy first sublayer on said first barrier layer while the temperature of said body is maintained between about 200°–400 ° C., the amount of Si in said first sublayer being sufficient to satisfy the solubility limit of Si in said alloy, forming a second barrier layer on said first sublayer, and sputtering an Al-based alloy second sublayer containing essentially no Si on said second barrier layer, wherein said first barrier layer, said first sublayer, said second barrier layer, and said second sublayer form a conductive layer, and said second sublayer is a major portion of a thickness of said conductive layer.

7. The method of claim 6 wherein said first sublayer comprises Al—Si—Cu, and said second sublayer comprises Al-Cu.

* * * * *